Figure 1:
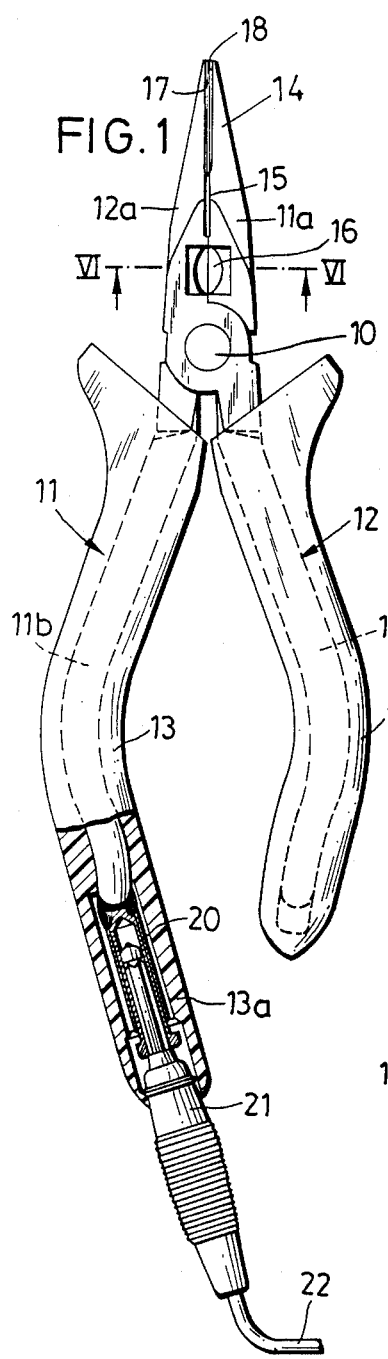

United States Patent [19]

Bohl et al.

[11] Patent Number: 4,736,480

[45] Date of Patent: Apr. 12, 1988

[54] CABLE WIRE TESTING PLIERS

[75] Inventors: Hans Bohl, Schlitz; Michael Galle, Remscheid; Rainer Gutermuth, Fulda, all of Fed. Rep. of Germany

[73] Assignee: Belzer-Dowidat GmbH Werkzeugunion, Fed. Rep. of Germany

[21] Appl. No.: 843,417

[22] Filed: Mar. 24, 1986

[30] Foreign Application Priority Data

Mar. 27, 1985 [DE] Fed. Rep. of Germany ....... 3511086

[51] Int. Cl.⁴ .............................................. B25F 1/00
[52] U.S. Cl. ............................................ 7/107; 7/129; 7/163; 324/72.5; 324/133; 439/482; 439/829
[58] Field of Search .................... 7/107, 125, 127, 129, 7/132, 158, 163, 164, 167, 170; 81/426; 324/133, 72.5, 158 P, 149; 30/90.4, 90.6–90.8, 91.2; 339/108 TP, 260, 261, 255 P

[56] References Cited

U.S. PATENT DOCUMENTS

| | | | |
|---|---|---|---|
| 1,406,486 | 2/1922 | Perlman | 30/91.2 X |
| 2,643,151 | 6/1953 | Zupanici | 7/127 X |
| 2,918,646 | 12/1959 | Davidson | 324/72.5 |
| 3,267,452 | 8/1966 | Wolf | 324/72.5 X |
| 3,337,801 | 8/1967 | Rinier et al. | 324/133 |
| 3,404,340 | 10/1968 | Labnie | 324/72.5 |
| 3,644,877 | 2/1972 | Carbonneau | 324/72.5 X |
| 3,737,832 | 6/1973 | Anderson | 339/261 X |
| 4,225,990 | 10/1980 | Theiler, Sr. | 7/107 |

Primary Examiner—Debra Meislin
Attorney, Agent, or Firm—Diller, Ramik & Wight

[57] ABSTRACT

The pliers form a cable wire testing tool. At the front end of a working portion (11a), a blade-type piercing member (18) is adapted to leave, in closed condition of the pliers, a free space relative to a surface of the other leg (12) serving as an abutment (17). In use, a cable wire is placed between the working portion (11a, 12a) of the pliers. Upon compressing the legs, the piercing member (18) penetrates the cable sheathing to establish with its point the electric contact between the cable core and the pliers' leg (11) which is provided with a connecting member (20) for the connection of a test cable (22). Due to the cable wire testing pliers, the customary stripping and securing of terminals may be avoided for testing cable wires.

2 Claims, 1 Drawing Sheet

U.S. Patent

Apr. 12, 1988

4,736,480

CABLE WIRE TESTING PLIERS

The invention relates to pliers comprising two legs crossing in a joint and having each a front region designed as a working portion and a rear region designed as a handle portion, and a stop limiting the closing movement, at least one working portion including a piercing member.

The customary pliers have been used either for cutting through items, in particular wires, or for holding workpieces. There have been also known strippers whose cutters, in closed condition of the tool, are mutually spaced to only cut through the insulation while the wire core is left substantially intact.

Communication cables, e.g. phone cables, contain a plurality of insulated cable wires. In case of extensive cable lengths, it is rather difficult to test splices concerning the continuity and lack of touch or contact between the leads. To this effect, electric voltage is applied to one wire at a cable end, while, at the other cable end, the remaining wires are tested as to occurring voltage. It is necessary in this connection to free both ends of the respective cable wire from their insulation sheath and to apply to said ends test-lead points or test terminals. Upon termination of the testing operation, the stripped ends are cut off.

Similar problems arise with the checking and locating of cable damages at a cable between two test points. In any case, the insulation must be first removed from the cable wires to then apply the test terminals. Subsequently, a corresponding insulation is to be ensured again to protect the cable core which should not be exposed.

It is the object of the invention to provide pliers of the type mentioned above which are suitable for testing cable wires and to considerably reduce the required working expenditure.

The problem is solved according to the invention in that, with respect to the stop, the piercing member is arranged in such a way that, in closed condition, it is spaced from the opposite working portion, and that at least one of the legs of the pliers contains an electric connecting means for a test cable.

The "cable wire testing pliers" formed according to the invention are adapted to puncture by means of the piercing member the core sheath at a very little point thus causing the piercing member to come into electric contact with the cable core, said contact extending further via the conductive material of the pliers'leg to the connecting means and from there to the test cable. In otherwords, due to the pliers, an electric contact may be established with the core of an insulated lead without the need of opening and stripping it beforehand. Further, not only opening and stripping problems are obviated, but soldering and splicing operations later required with the known procedures are excluded as well. Due to the free space between the pliers'legs in the contact range, the conductor is not cut through. In use, pressure is exerted on the cable wire testing pliers until a contact is established between the piercing member and the cable core. The established contact is indicated by bell or light signals. Thus, only a slight pressure is applied to the cable core, the sheathing being damaged only locally to quite a reduced extent without entailing the removal of insulating material. The insulating condition of the cable remains substantially unchanged.

Preferably, it is provided that the other working portion opposite to the piercing member contains a flat corrugated abutment. If so, only the working portion of the one leg of the pliers is provided as a piercing member while the other forms the flat abutment to press thereagainst the insulated cable wire. The depth of the corrugation of the flat abutment is so unimportant that the material of the cable insulation will not be penetrated or damaged.

According to a preferred embodiment of the invention, the piercing member is a blade extending in longitudinal direction of the one working portion. To this end, the pliers may be pointed so that the working portions form a nose tapered forwardly. As a result, the pliers will be adapted to sort wires at narrow points of difficult access and to single out a specific wire from a bunch for testing purposes, by clamping it transversely between the working portions.

The piercing member may be at a working portion section being farthest away from the joint, while another section is provided in which, in closed condition, the working portions flatly abut against one another. Such a tool may be used additionally as flat-nose pliers or holding pliers because, by means of the additional section, pieces may be held. Alternatively or additionally, one section of the pliers may be provided with blades which, in closed condition of the pliers, are meeting to permit to cut materials.

Preferably, the connecting means is mounted at the rear end of the pliers'leg which also contains the piercing member, and it forms an extension of said leg accordingly.

The connecting means does not affect the pliers in use nor does it reduce its mechanical stability.

The connecting means is formed by a socket sheathed with insulating material and electrically connected to the respective leg of the pliers. The electric conductivity of the leg is used for the test work. The connecting socket is electrically joined to the leg coming into direct contact with the cable wire. By this means, uncertain transition resistances in the joint zone of the pliers are avoided.

According to a preferred embodiment of the invention, the insulating material encompassing the connecting socket is integrally formed with an insulating covering of the handle portion of the leg to project rearwardly beyond the covering of the other leg of the pliers. Such a type of pliers may be produced by simple means and at low cost, its use is practically unaffected by the connecting means and a safe and trouble-free contact with the test cable is ensured as well.

Figure 2:
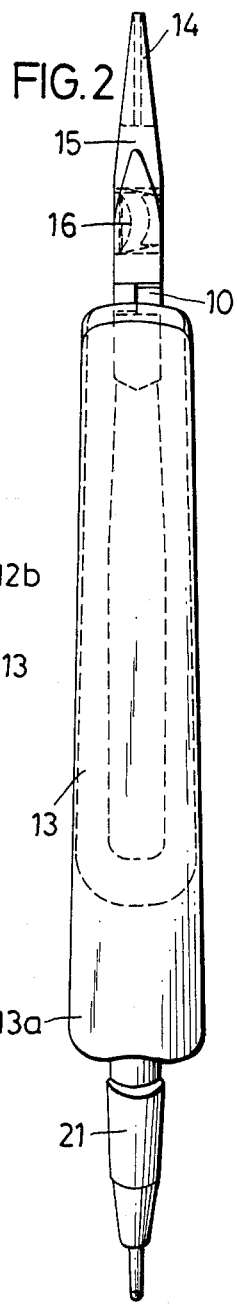
Figure 3:
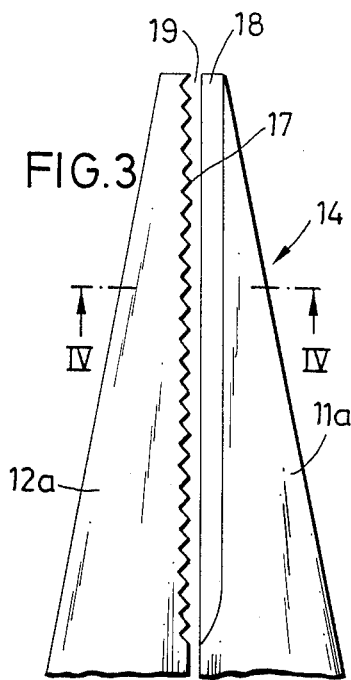
Figure 4:
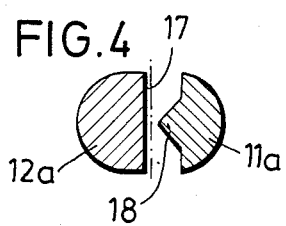
Figure 5:
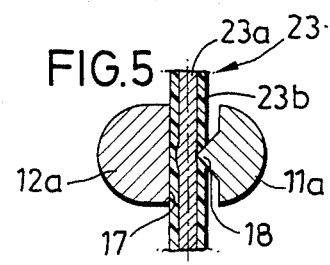
Figure 6:
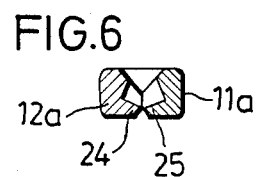

One embodiment of the invention will be explained hereunder in detail with reference to the accompanying drawings in which FIG. is a side elevational view of the cable wire testing pliers, FIG. 2 is a front elevation of the wire testing pliers FIG. 3 is a enlarged view of the front ends of the pliers' legs in closed condition, FIG. 4 is a cross sectional view taken along line IV—IV of FIG. 3, FIG. 5 shows the working elements such as illustrated in FIG. 4, as they are piercing the insulating sheath of a cable wire, and FIG. 6 is a cross sectional view along line VI—VI of FIG. 1.

The illustrated cable wire testing pliers comprise two legs 11 and 12 intersecting in the joint 10 and consisting each of the front working portion 11a or 12a and of the rear handle portion 11b or 12b, both handle portions 11b,12b being coated each by an ergonomically shaped insulating plastic sheath 13.

As evident, the working portions are divided into a front testing section 14, a central holding section 15 and a separating section 16 which is confronted with the joint 10. The testing section 14 is shown in FIG. 3. The side of working portion 12a confronted with working portion 11a forms a flat corrugated abutment 17. The side of the working portion 11a which is opposite to the latter is provided with a piercing member 18 in the form of a longitudinal blade whose point is directed towards the abutment 17 and extends through the longitudinal central plane of the working portions 11a and 12a. The piercing member 18 is symmetrical to said longitudinal central plane and has a cross section that forms an acute angle.

The closing movement of legs 11 and 12 is limited in that they abut against each other in the clamping range 15 and in the cutting range 16 in which condition a free space 19 is formed between the point of piercing member 18 and the opposite abutment 17. The free space 19 is largest at the pliers' front end to decrease towards the rearward end of testing section 14.

The pliers' legs 11 and 12 are made of steel and are accordingly conductive. Handle portion 11b is provided with a connecting means 20 consisting of a substantially cylindrical plug socket which elongates the handle portion 11b in rearward direction. Similarly, the insulating cover 13 of handle portion 11b is provided with an extension 13a enclosing laterally the connecting means 20 and projecting rearwardly beyond the latter. Connecting means 20 is adapted to receive the contact of a single-pole plug 21 which is joined to a test cable 22, the handle of plug 21 protruding longitudinally from the end of extension 13a whose opening at the end encompasses tightly the handle of plug 21 so that extension 13a does not only enclose the contact region but also the front region of the handle of plug 21.

In use, testing section 14 of the cable wire testing pliers is applied to a lead 23, as illustrated in FIG. 5, showing that insulating sheath 23b is backed by the abutment 17. Upon compressing legs 11 and 12, the piercing member 18 of working portion 11a penetrates the insulating sheath 23b from one side until its point contacts the lead core 23a thus establishing via the pliers' leg 11 an electric contact between cable core 23a and test cable 22. If, subsequently, the legs are moved apart again, the narrow gap produced by the piercing member 18 in core sheath 23b automatically closes partly due to the restorability of the plastic material forming the lead sheath.

The piercing member 18 need not necessarily consist of a continuous blade, but it may be formed of individual pointed needles or the like.

According to FIG. 6, the separating section or range 16 of the pliers includes two blades 24,25 which come into contact when the rear handle portions 11b, 12b of the legs 11, 12 are compressed. By this means, the pliers may be also used to pinch off wires or leads.

What is claimed is:

1. Pliers comprising a pair of legs, means connecting said legs together for relatively pivoting movement between a first operative position and a second inoperative position, each leg having a front working portion and a rear handle portion, at least one of said front working portions having means for piercing the sheet of an electric conductor in said first operative position of said legs, means for maintaining a predetermined gap between said piercing means and the other of said working portions in said first operative position of said legs, means attached to one of said rear handle portions for placing said piercing means in electrical conductivity with a test cable, said other of said working portions defining a generally elongated corrugated abutment portion in opposing relationship to said piercing means, said piercing means being an elongated blade, said elongated corrugated abutment portion and said elongated blade each having a generally longitudinal axis, said longitudinal axes being in generally parallel relationship to each other, said electrical conductivity placing means being a socket enclosed by insulating means which is adapted to removably receive an associated test cable which when removed permits "normal" use of the pliers, a medial working section between said front working portions and said pivot connecting means, said medial working section includes surfaces of said pair of legs which are in abutment with each other in the first operative position of said legs, and said medial working section constituting said gap maintaining means.

2. The pliers as defined in claim 1 wherein said one rear handle portion includes an end remote from said piercing means, said insulating means being a tubular portion projecting beyond said one rear handle portion end, and said socket being located within said tubular portion.

* * * * *